(12) United States Patent
Tu

(10) Patent No.: US 6,207,525 B1
(45) Date of Patent: Mar. 27, 2001

(54) METHOD TO FABRICATE ELECTRODES FOR HIGH-K DIELECTRICS

(75) Inventor: Yeur-Luen Tu, Taichung (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/265,357

(22) Filed: Mar. 10, 1999

(51) Int. Cl.[7] .................................................. H01L 21/20
(52) U.S. Cl. ......................................... 438/396; 438/240
(58) Field of Search .............................. 438/396, 3, 240, 438/253, 254, 381, 689, 690, 691, 692

(56) References Cited

U.S. PATENT DOCUMENTS 5,998,225 * 12/1999 Crenshaw et al. ...................... 438/3

* cited by examiner

*Primary Examiner*—David Nelms
*Assistant Examiner*—Quoc Hoang

(57) ABSTRACT

The present invention proposed a method for fabricating electrodes, especially the electrodes for capacitors which incorporates the application of high dielectric constant dielectrics. The present process avoids the conventional etching issues with conductive materials, especially conductive materials like platinum (Pt), Ruthenium oxide ($RuO_2$), Iridium oxide ($IrO_2$) and etc. A method in the invention for fabricating electrodes on a semiconductor substrate includes the following steps. After a first step forming a node-defining layer on the substrate, a subsequent step of patterning the node-defining layer is carried out to form a plurality of node openings within the node-defining layer. A first conductive layer is formed to fill into the openings and to form over the node-defining layer. A step of removing a portion of the first conductive layer is performed to the portion which is located outside the openings. Finally, a step of removing the node-defining layer is done to leave a plurality of first electrodes.

15 Claims, 3 Drawing Sheets

METHOD TO FABRICATE ELECTRODES FOR HIGH-K DIELECTRICS

FIELD OF THE INVENTION

The present invention relates to a semiconductor manufacturing process. More specifically, the present invention relates to a method for fabricating electrodes, especially the electrodes incorporating the use of high-k dielectrics to form capacitors.

BACKGROUND OF THE INVENTION

In last four decades, the semiconductor industry has been developed continuously to fabricate integrated circuits with highly effective and densely packed devices. In the application of integrated circuits, memory chips is one of the most important chips in the application of electronic products. With the fast growth of computer, communication, and consumer electronic devices, the need for high density and low cost memory chips, either volatile memories like DRAMs (dynamic random access memories) and SRAMs (static random access memories) and nonvolatile memories like flash memories, is increasing quickly for improving the functions of the devices. Typically, a single chip may include more than a million or even a billion devices to expand memory capacity or functional characteristics of integrated circuits. Taking DRAMs as an example, the capacity of a single chip has been raised from 16 megabytes, 64 megabytes to 256 megabytes or even higher capacities.

Typically, the construction of a DRAM cell mainly includes a operating transistor and a storage cell composed mainly of a capacitor. For increasing the device density of memory cells in an unit area, the size of the operating transistor and the capacitor must be reduced without damaging the operational characteristics and the storage capacity of the capacitor. Several different methods, such as the reconstruction of the storage electrode and the selection of the materials of the electrode and dielectrics, had been proposed to increase the storage capacity of a small size cell.

In the present stage technology of semiconductor fabrication, dielectrics with high dielectric constant, or namely high k dielectrics, are employed in the fabrication of both volatile and non-volatile memory cells to improve their functional characteristics. High k dielectrics such as barium strontium titanate (BST) and lead zirconate titanate (PZT) are well known to be good candidates for DRAM higher than 4 gigabyte and high density, highly capacitive nonvolatile memories. Electrode materials such as platinum (Pt), Ruthenium oxide ($RuO_2$), Iridium oxide ($IrO_2$) and etc. can be used in combination with aforementioned high k dielectrics for providing improved capacitive effects.

However, the aforementioned electrode materials are not the commonly used electrode materials like polysilicon, titanium, and aluminum-based metals employed in present stage semiconductor fabrication. The etching chemistry, control and contamination problems are considered as some of the obstacles in the application of these newly-employed materials. As an example, traditional platinum etching process for defining prescribed patterns was typically suffered from the contamination and control problems of volatile platinum etching byproducts, and also the resulting problem of poor CD (critical dimension) control.

In addition to the selection of conductive materials and dielectrics, another approach to increase the performance of DRAM cell is by increasing surface area of electrodes to increase storage capacity. One of conventional approaches on increasing the surface area of electrodes is to re-construct the shape of the major electrode, or namely the bottom electrode, in order to increase the surface area with the re-constructed shape like extended fins or the application of hemispherical grains of polysilicon. However, the newly-employed materials like platinum (Pt), Ruthenium oxide ($RuO_2$), Iridium oxide ($IrO_2$) and etc., under the limitation in etching control, are hard to define with complex shapes. The increase of surface area of these newly-employed materials are further limited with the hardness in shape definition.

SUMMARY OF THE INVENTION

The present invention is directed to a method to fabricate electrode for high-k dielectrics. The method proposed herein, with the shape defining layer without employing traditional etching processes, enables good critical dimension control in defining the shape and size of electrical nodes for capacitor cells. In the preferred embodiments of the present invention, the surface area of the electrodes is further increased with the control of chemical mechanical polishing and processing slurries.

A method in the invention for fabricating electrodes on a semiconductor substrate includes the following steps. After a first step forming a node-defining layer on the substrate, a subsequent step of patterning the node-defining layer is carried out to form a plurality of node openings within the node-defining layer. A first conductive layer is formed to fill into the openings and to form over the node-defining layer. A step of removing a portion of the first conductive layer is performed to remove the portion which is located outside the openings. Finally, a step of removing the node-defining layer is done to leave a plurality of first electrodes.

In addition to the aforementioned steps of forming the first electrodes, two more steps may be added to finish the formation of capacitor cells. At first, a dielectric layer is formed over the first electrodes after the removal of the node-defining layer. A subsequent step of forming a second conductive layer is carried out to form the second conductive layer over the dielectric layer, with preferably the same material as the first electrodes.

BRIEF DESCRIPTION OF THE DRAWINGS

The foregoing aspects and many of the attendant advantages of this invention will become more readily appreciated as the same becomes better understood by referencing the following detailed description, when taken in conjunction with the accompanying drawings, wherein.

DETAILED DESCRIPTION OF THE PREFERRED EMBODIMENT

The present invention proposed a method for fabricating electrodes, especially the electrodes for capacitors which incorporates the application of high dielectric constant dielectrics. With the employment of node-defining layer in the present invention, a deposited conductive material can be formed over a semiconductor with the prescribed shape of openings. The present process avoids the conventional etching process of conductive materials, especially conductive materials like platinum (Pt), Ruthenium oxide ($RuO_2$), Iridium oxide ($IrO_2$) and etc. The related critical dimension control is also avoided. With the proposed approach of chemical mechanical polishing in the present invention under the slurry control and process variation with thickened first conductive layer, the surface area of first electrodes is further increased.

Figure 1:
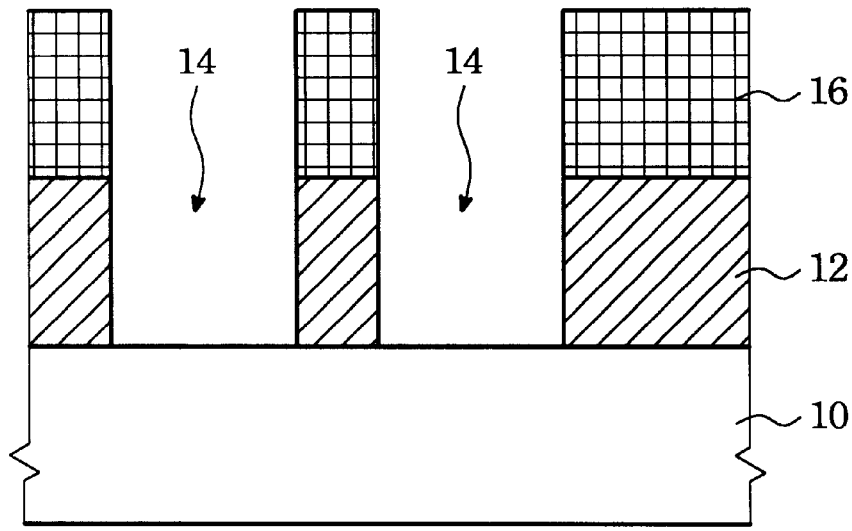
FIG. 1 is a cross sectional view to illustrate the formation and patterning of a node-defining layer on a semiconductor substrate in accordance with the present invention.

Without limiting the scope of the present invention, the preferred embodiments of the method is described with following illustrations. Referring to FIG. 1, a semiconductor substrate 10 is provided at first for forming electrodes thereon. Typically, the semiconductor substrate 10 has isolations such as field oxide region or trench isolation, and devices like transistors previously formed thereover, in order to be processed with following steps to make storage cells. The substrate is preferably a silicon substrate, and more preferably in a <100> crystallographic orientation, however, other materials and substrates with different crystallographic orientations can also be used alternatively.

Next, a node-defining layer 12 is formed on the substrate 10, in order to be defined with node shape therein for forming electrical nodes. The node-defining layer 12 is actually a sacrificial layer for the sole purpose of defining shapes and will be removed later, and materials like dielectrics or photoresist can be employed for the node-defining layer 12. Dielectrics like silicon oxide or silicon nitride and well known photoresists are preferably employed in the preferred embodiments to be formed with a preferred thickness between about 3000 to 8000 angstroms.

The node-defining layer 12 is then patterned to form a plurality of node openings 14 within the node-defining layer 12. A typical shape of cylindrical, elliptic, or even rectangular and other specified shapes of openings can be defined. In the example of using dielectrics as the node-defining layer 12, the openings 14 can be patterned with an overlying photoresist layer 16 and accompanying lithography and etching processes. The photoresist layer 16 is then removed. In another example of employing a photoresist layer as the node-defining layer 12, the openings 14 are defined by applying simplified processes of exposure and development in conventional lithography processes.

Figure 2:
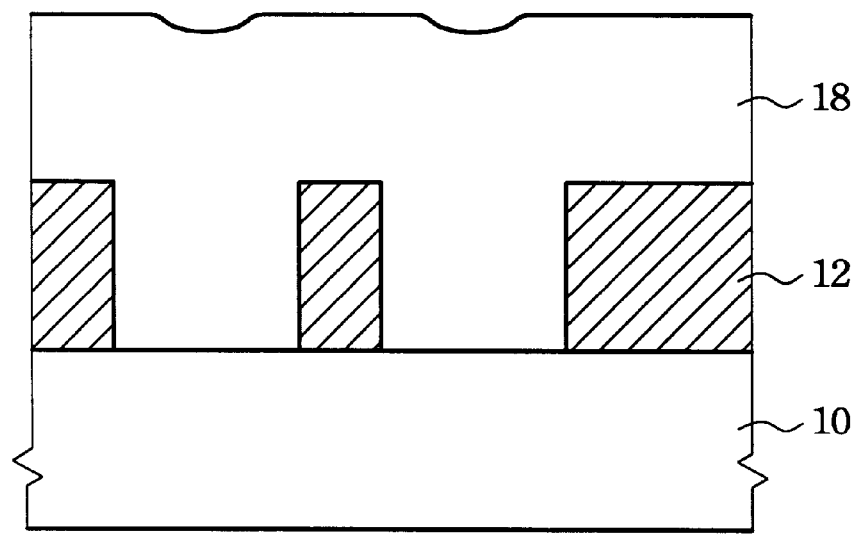
FIG. 2 is a cross sectional view to illustrate the formation of a first conductive layer which fills into the openings and forms over the node-defining layer, in accordance with the present invention.

Referring to FIG. 2, a first conductive layer 18 is then formed to fill into the openings 14 and also to form over the node-defining layer 12. In the preferred embodiments, the first conductive layer 18 is composed of conductive materials such as platinum (Pt), Ruthenium oxide ($RuO_2$), Iridium oxide ($IrO_2$), Iridium (Ir), Ruthenium (Ru) and the like. To fill into the node defining gaps or openings 14, the first conductive layer 18 is deposited with about 2000 to 4000 angstroms or more in thickness. The aforementioned conductive materials is typically deposited with chemical vapor deposition (CVD) or physical vapor deposition (PVD), and is preferably deposited with low temperature sputtering techniques such as collimator sputtering or long throat sputtering especially for the embodiments incorporating a photoresist layer as the node-defining layer 12. In the low temperature sputtering approach with a temperature under 150° C. or even as low as a room temperature of 25° C., the defined shape of the photoresist layer can be well maintained without shape deformation under other high temperature chemical vapor deposition approaches with a temperature as high as 300° C. or more.

Figure 3:
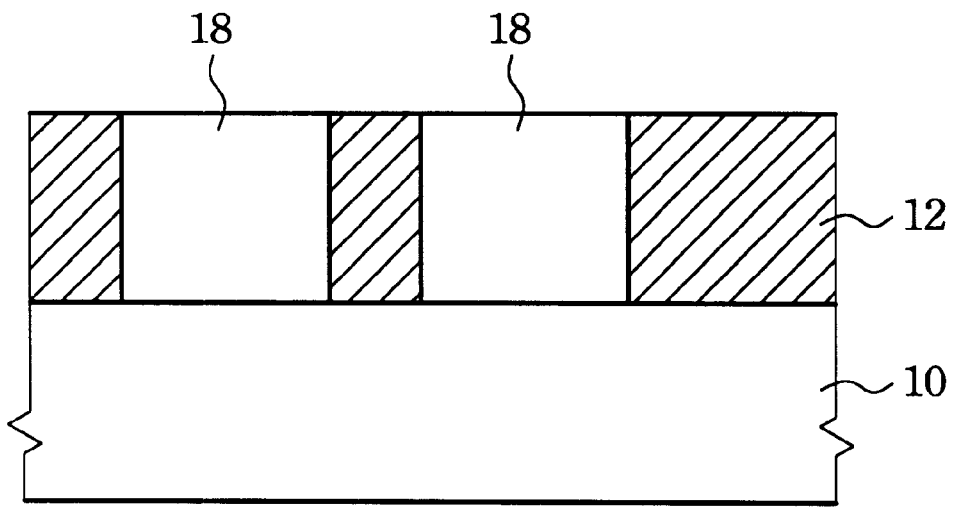
FIG. 3 is a cross sectional view of removing a portion of the first conductive layer locating outside the openings in accordance with the present invention.
Figure 4:
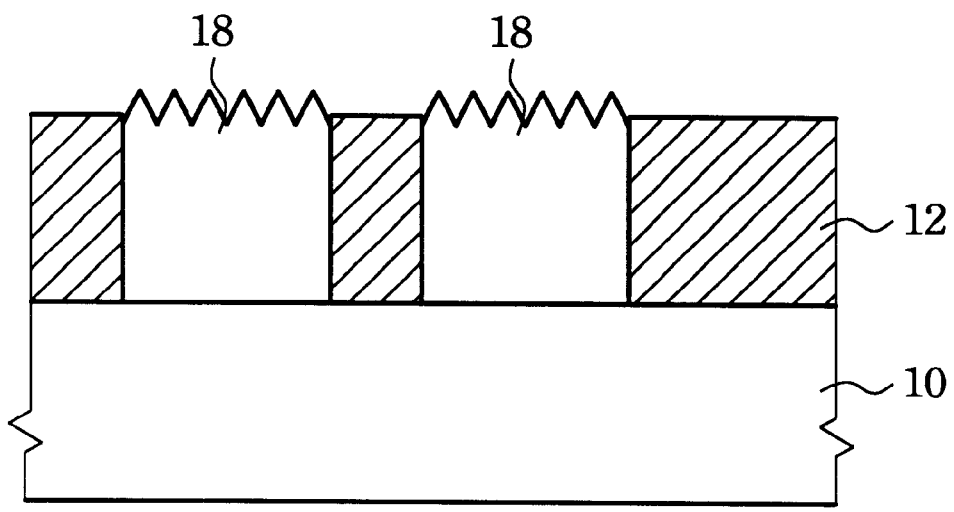
FIG. 4 is a cross sectional view to illustrate another approach of removing a portion of the first conductive layer to left a rough top surface, in accordance with the present invention.

Turning to FIG. 3, a portion of the first conductive layer 18 locating outside the openings 14 and over the node-defining layer 12 is then removed. Various typical planarization techniques such as chemical mechanical polish (CMP) and equivalents are employed in the preferred embodiments. In a more preferred embodiments, a chemical mechanical polish with the addition of coarse slurries, which have particle sizes ranging between about 500 to 2000 angstroms in the case, is employed to polish the top surface of the first conductive layer 18, in order to leave a rough surface which may has a surface roughness as high as 800 angstroms or more, as shown in FIG. 4.

Another approach to increase the surface area of the polished electrodes is to use a thicker first conductive layer 18, which may has a top surface about 2000 to 7000 angstroms higher then that of the node-defining layer 12, in order to prolong the polish process. Under the excessive polish time, the abrasive action of the slurry and the in-situ particles released by the polishing process potentially makes the polished surface rougher. As an example, the surface roughness of as-deposited first conductive layer 18 is less than 50 angstroms, however, the surface roughness after the aforementioned approach can be raised to about 800 angstroms or more. Therefore, the total surface area, or namely functional capacitor area, is significantly increased. The increase in surface area with the two proposed approaches is between about 1.5 to 3 times as that of a flat conductive material surface.

Figure 5:
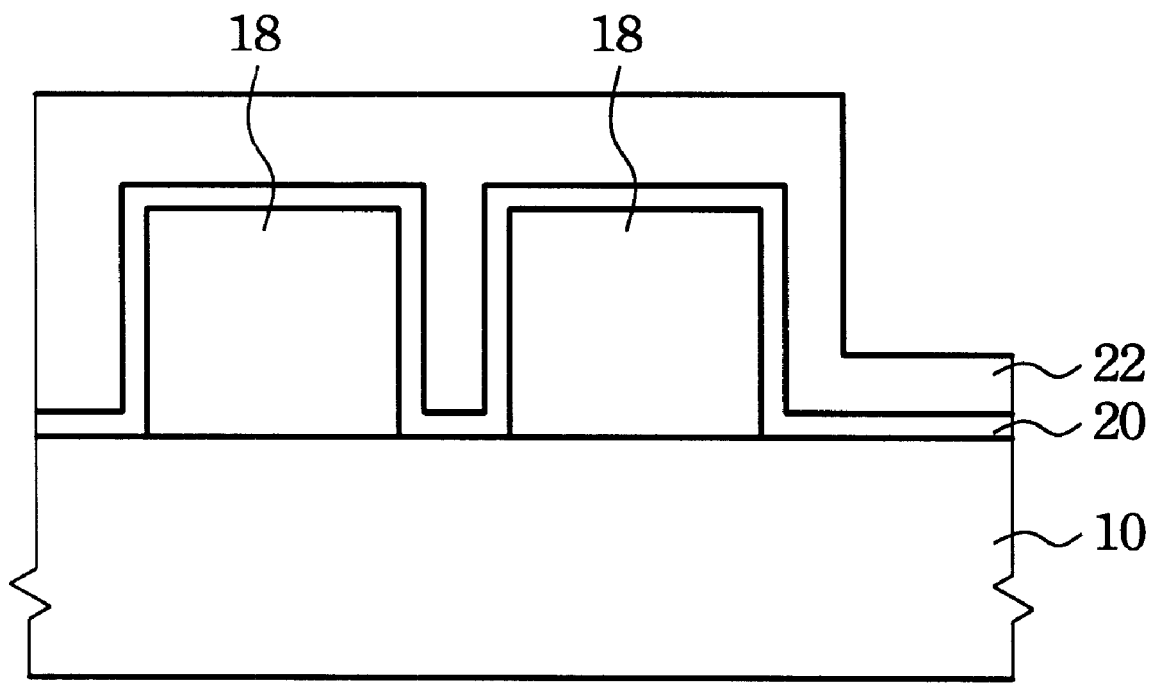
FIG. 5 is a cross sectional view to illustrate the formation of capacitor cells in accordance with the present invention.

Next, the node-defining layer is removed to leave a plurality of first electrodes 18 as shown in FIG. 5. In the example of using dielectrics as the node-defining layer 12, the remained silicon oxide is preferably dipped off with wet process employing etchants such as diluted HF (DHF) or buffered oxide etch (BOE), and the remained nitride, if employed, is preferably removed with hot phosphorus acid ($H_3PO_4$). In another example of employing a photoresist layer as the nodedefining layer 12, the photoresist can be removed with well known stripping process and the first electrodes 18 are thus left over the substrate 10 as shown in the figure.

In addition to the aforementioned processes of forming the first electrodes 18, two more steps are preferably added to finish the formation of capacitor cells. At first, a dielectric layer 20 is formed over the first electrodes 18 after the removal of the node-defining layer 12, preferably with dielectrics having high dielectric constants over 200, such as barium strontium titanate (BST), lead zirconate titanate (PZT), lanthanum-doped PZT (PLZT) and the like, in order to improve the capacitive effect and functional characteristics of the capacitor cells, with a preferred thickness between about 50 to 200 angstroms. A subsequent step of forming a second conductive layer 22 is performed to form the second conductive layer 22 over the dielectric layer 20, with preferably the same material as the first electrodes 18, such as platinum (Pt), Ruthenium oxide ($RuO_2$), Iridium oxide ($IrO_2$), Iridium (Ir), Ruthenium (Ru) and the like in the case, with a preferred thickness between about 500 to 1000 angstroms or more, if needed. However, other conductive materials like polysilicon and metal can also be utilized.

Therefore, the method of present invention on forming electrodes with accompanying high k dielectrics, as described the illustrated cases, avoids the etching issue and related critical dimension control issue in the conventional approaches, especially for the application of newly employed materials such as platinum (Pt), Ruthenium oxide ($RuO_2$), Iridium oxide ($IrO_2$), Iridium (Ir), Ruthenium (Ru) and the like. With the low temperature sputtering techniques, the proposed method reduces processing steps without employing dielectric deposition, etching, and wet dip steps. The surface area of the electrodes is significantly raised with the present invention.

As is understood by a person skilled in the art, the foregoing description of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of fabricating electrodes on a semiconductor substrate, said method comprising the steps of:

forming a node-defining layer on said substrate;

patterning said node-defining layer to form a plurality of node openings within said node-defining layer;

forming a first conductive layer to fill into said openings and to form over said node-defining layer, wherein said first conductive layer is deposited with a low temperature sputtering at a temperature under 150° C.;

removing a portion of said first conductive layer located outside said openings with a chemical mechanical polish, wherein said chemical mechanical polish is carried out with coarse slurries having particle sizes between about 500 to 2000 angstroms; and removing said node-defining layer to leave a plurality of first electrodes.

2. The method of claim 1, wherein said node-defining layer is selected from the group consisting of silicon oxide and silicon nitride.

3. The method of claim 1, wherein said node-defining layer comprises a photoresist layer.

4. The method of claim 1, wherein said first conductive layer is selected from the group consisting of platinum, ruthenium oxide, Iridium oxide, Iridium and Ruthenium.

5. The method of claim 1, wherein said first conductive layer is deposited to have a top surface of said first conductive layer about 2000 to 7000 angstroms higher then a top surface of said node-defining layer.

6. The method of claim 1 further comprising the steps of:

forming a dielectric layer over said plurality of first electrodes after removal of said node-defining layer; and forming a second conductive layer over said dielectric layer.

7. The method of claim 6, wherein said dielectric layer comprises a high dielectric constant dielectric material having a dielectric constant over 200.

8. The method of claim 6, wherein said dielectric layer is selected from the group consisting of barium strontium titanate (BST), lead zirconate titanate (PZT), and lanthanum-doped PZT (PLZT).

9. The method of claim 6, wherein said second conductive layer is selected from the group consisting of platinum, ruthenium oxide, Iridium oxide, Iridium and Ruthenium.

10. A method of fabricating electrodes on a semiconductor substrate, said method comprising the steps of:

forming a node-defining layer on said substrate;

patterning said node-defining layer to form a plurality of node openings within said node-defining layer;

forming a first conductive layer to fill into said openings and to form over said node-defining layer, wherein said first conductive layer is deposited with a low temperature sputtering at a temperature under 150° C.;

removing a portion of said first conductive layer located outside said openings with a chemical mechanical polish, wherein said chemical mechanical polish is carried out with coarse slurries having particle sizes between about 500 to 2000 angstroms;

removing said node-defining layer to leave a plurality of first electrodes;

forming a dielectric layer over said plurality of first electrodes after removal of said node-defining layer; and forming a second conductive layer over aid dielectric layer.

11. The method of claim 10, wherein said node-defining layer is selected from the group consisting of silicon oxide and silicon nitride.

12. The method of claim 10, wherein said node-defining layer comprises a photoresist layer.

13. The method of claim 10, wherein said first conductive layer and said second conductive layer are selected from the group consisting of platinum, ruthenium oxide, Iridium oxide, Iridium and Ruthenium.

14. The method of claim 10, wherein said first conductive layer is deposited to have a top surface of said first conductive layer about 2000 to 7000 angstroms higher then a top surface of said node-defining layer.

15. The method of claim 10, wherein said dielectric layer is selected from the group consisting of barium strontium titanate (BST), lead zirconate titanate (PZT), and lanthanum-doped PZT (PLZT).

* * * * *